United States Patent [19]

Yang et al.

[11] Patent Number: 5,358,893
[45] Date of Patent: Oct. 25, 1994

[54] ISOLATION METHOD FOR SEMICONDUCTOR DEVICE

[75] Inventors: Won-suk Yang, Suwon; Min-uk Hwang; Chang-gyu Hwang, both of Seoul, all of Rep. of Korea

[73] Assignee: Samsung Electronics Co., Ltd., Kyungki-do, Rep. of Korea

[21] Appl. No.: 118,818

[22] Filed: Sep. 10, 1993

[30] Foreign Application Priority Data

Jun. 10, 1993 [KR] Rep. of Korea ............... 93-10568

[51] Int. Cl.$^5$ .................................. H01L 21/76
[52] U.S. Cl. .................................. 437/70; 437/69; 437/72; 437/73; 437/968; 148/DIG. 117
[58] Field of Search ............. 437/69, 70, 72, 73, 437/968; 148/DIG. 117

[56] References Cited

U.S. PATENT DOCUMENTS

| | | | |
|---|---|---|---|
| 4,755,477 | 7/1988 | Chao | 437/73 |
| 5,137,843 | 8/1992 | Kim et al. | 437/70 |
| 5,173,444 | 12/1992 | Kawamura | 437/72 |
| 5,196,367 | 3/1993 | Lu et al. | 437/968 |
| 5,252,511 | 10/1993 | Bhan et al. | 437/968 |
| 5,254,494 | 10/1993 | Van Der Plas et al. | 437/70 |

FOREIGN PATENT DOCUMENTS

| | | | |
|---|---|---|---|
| 0424018 | 4/1991 | European Pat. Off. | |
| 0296741 | 12/1986 | Japan | 437/69 |
| 0145833 | 6/1987 | Japan | |
| 0204746 | 8/1988 | Japan | |
| 0012529 | 1/1992 | Japan | 437/70 |

*Primary Examiner*—Tom Thomas
*Assistant Examiner*—Trung Dang
*Attorney, Agent, or Firm*—Cushman, Darby & Cushman

[57] ABSTRACT

An improved isolation method in a semiconductor device of selective polysilicon oxidation (SEPOX) which can create a field oxide layer having a size below the optical resolution and good isolation characteristics. A buffer layer comprised of polysilicon or amorphous silicon is formed on a semiconductor substrate, and then an anti-oxidative pattern with an opening which defines an isolation region exposing a portion of the buffer layer is formed. Then a portion of the exposed buffer layer is isotropically etched in order to form an undercut portion in the lower portion around the opening. Then an anti-oxidative spacer filling the undercut portion is formed on the sidewall of the opening. Thereafter, a field oxide layer is formed by partially oxidizing the portion of the buffer layer exposed by the opening and the semiconductor substrate exposed in the opening. The size of bird's beak is decreased, thereby forming a field oxide layer with good isolation characteristics and small size.

16 Claims, 9 Drawing Sheets

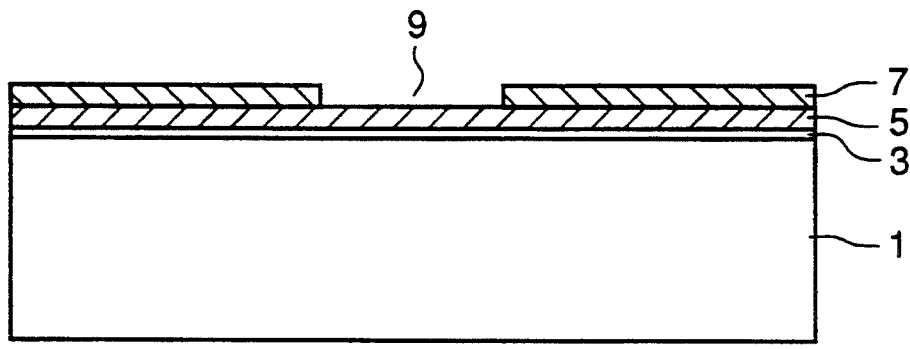
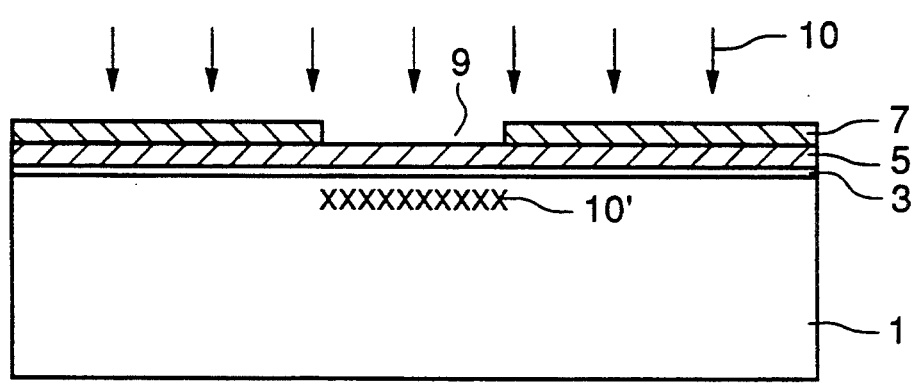
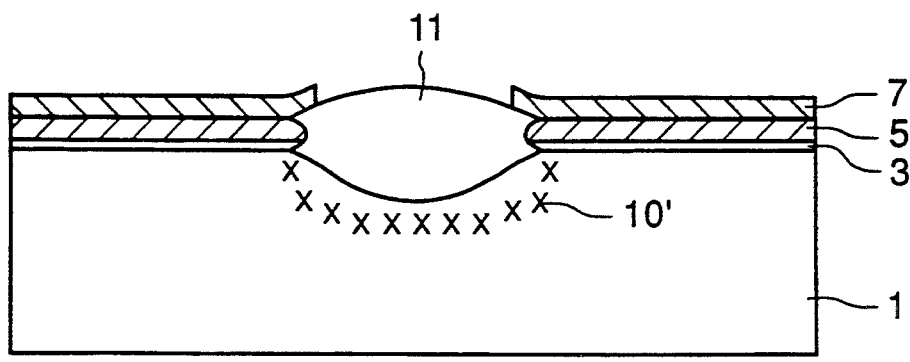

ISOLATION METHOD FOR SEMICONDUCTOR DEVICE

FIELD OF THE INVENTION

This invention relates generally to an isolation method for semiconductor devices, and more particularly to the selective oxidation of polysilicon, which is an improved method of local oxidation of silicon (LOCOS).

BACKGROUND OF THE INVENTION

It is necessary that each element of an integrated circuit formed on a silicon substrate be electrically isolated. Recently, technologies for reducing the width of isolation regions and for reducing element size have been developed in the advancement of highly integrated semiconductor devices. Competition among semiconductor manufacturers is focusing efforts in the field of isolation techniques.

In the initial stages of the semiconductor industry, bipolar integrated circuits were mainstream. Accordingly, a junction isolation technique for isolating the bipolar integrated circuit was invented. This junction isolation technique was very simple, but had certain drawbacks; namely, that the isolation region was too large and therefore caused large parasitic capacitance, degrading the speed and performance of the circuit.

Metal Oxide Semiconductor (MOS) transistors were also developed. A MOS transistor has an entirely different structure from that of a bipolar transistor, necessitating a different isolation structure. Because of this, the LOCOS technique was developed, forming a semi-recessed oxide in the nonactive area (field area or isolation region) of the semiconductor substrate.

The LOCOS technique has been widely used because of its advantageous properties of decreased junction capacitance, decreased parasitic effects, self-alignment processing, and less lateral expansion when compared to the conventional junction isolation technique. However, according to a conventional LOCOS method, the field oxide greatly encroaches on the active area and thus forms a large bird's beak structure, in turn causing an uneven surface which is inadequate for applying sub-micron lithography techniques. Defects therefore occur due to long periods of oxidation, causing impurities to be redistributed.

A number of modified LOCOS methods were proposed to overcome these defects. For example: 1) a method for forming a field oxide layer by oxidizing a recessed portion of the substrate; 2) an etched-back LOCOS method in which a portion of the field oxide layer is etched back after the field oxide has been grown, thereby reducing the bird's beak and obtaining a more planarized surface; 3) a poly-buffered LOCOS method in which a poly-buffer pad film (50 nm of polysilicon and 5-10 nm of oxide film) and a thick nitride film (100-240 nm) are used instead of the conventional pad oxide film; 4) a sealed-interface local oxidation (SILO) method in which a silicon nitride layer is directly formed on the silicon substrate before forming the pad oxide layer thereon; and 5) a sidewall-masked isolation technique (SWAMI) in which a sidewall mask is used to reduce the bird's beak. In addition, some isolation methods have been proposed whereby the semiconductor substrate is not oxidized, for example trench isolation and selective epitaxial growth, but these methods have apparently not yet been put to practical use.

Among the above modified LOCOS techniques, the poly-buffered LOCOS technique is drawing attention as an isolation technique for DRAM devices because of its good control of bird's beak, which thereby minimizes the stress related to junction leakage. The poly-buffered LOCOS technique is also called selective polysilicon oxidation (SEPOX) because a field oxide film is formed by selectively oxidizing polysilicon. This SEPOX technique is detailed in a paper entitled "A 0.5 μm Isolation Technology Using Advanced Polysilicon Pad LOCOS (APPL)," by T. Nishihara et al. (IEDM 1988, pp 100-103).

FIG. 1 through FIG. 4 are sectional views for illustrating the conventional SEPOX technique mentioned above.

FIG. 1 illustrates the step of forming a buffer layer 5 and a silicon nitride layer 7 having an opening 9 defining an isolation region. Referring to FIG. 1, a thin pad oxide film 3 is formed on a semiconductor substrate 1 by thermal oxidation, and then a buffer layer 5 is formed on the pad oxide film 3. Buffer layer 5 relieves the stress caused by the bulk expansion which occurs when a field oxide layer is formed for element isolation. Buffer layer 5 is formed by the deposition of a polycrystalline or an amorphous silicon. Then, a silicon nitride layer 7 is formed by depositing a nitride silicon on buffer layer 5, and a photoresist film is formed by coating a photoresist on silicon nitride film 7. The thus-formed photoresist film is then exposed, using a photomask, and then developed to thereby form a photoresist pattern (not shown) with an opening 9 defining the isolation region. Next, the opening 9 is formed by etching the silicon nitride film 7 using the above photoresist pattern as an etching mask, and the remaining photoresist pattern is stripped away.

FIG. 2 illustrates the step of implanting ions to form a channel-stop layer. Ions 10 are implanted via opening 9 into the surface portion of the semiconductor substrate 1, in order to form a channel-stop layer for preventing field inversion. Reference numeral 10' shows the implanted ions in the surface portion of semiconductor substrate 1.

FIG. 3 illustrates the step of forming a field oxide layer 11. A field oxide layer 11 is formed by partially oxidizing the exposed area of the buffer layer 5, along with the surface portion of the semiconductor substrate 1 which is defined by opening 9.

FIG. 4 illustrates the step of removal of the silicon nitride film 7 and buffer layer 5 by a conventional method.

According to the above SEPOX technique, buffer layer 5 is subject to an oxidation stress caused by bulk expansion which occurs when the field oxide layer is formed. After forming the field oxide layer 11, the portion where significant stress has been applied in the oxidation process is removed, thereby reducing the stress due to the oxidation in the active region where the elements are to be formed. This prevents failures which might be caused by leakage current.

The conventional SEPOX technique has drawbacks. For instance, it generates two bird's beaks due to the diffusion speed difference of an oxidant. FIG. 5 is an enlarged sectional view of a field oxide layer 11. A first bird's beak (FBB) is generated between the buffer layer 5 and the semiconductor substrate 1. A second bird's beak (SBB) is generated between the buffer layer 5 and the silicon nitride layer 7. When a semiconductor wafer is exposed to the atmosphere after the formation of the polysilicon layer such as buffer layer 5, native oxide grows on the polysilicon layer. Oxidant diffusion is faster in this native oxide than in the polysilicon layer, resulting in the formation of the second bird's beak SBB.

As the second bird's beak becomes larger, the polysilicon between the first and second bird's beak becomes more difficult to remove. In addition, if the second bird's beak is excessively large, and the active region is small, the second bird's beak may become connected to the second bird's beak of an adjacent field oxide layer, thereby covering the polysilicon layer which remains. This is called a second bird's beak encroachment and is shown in FIG. 6.

Referring to FIG. 6, a second bird's beak of two adjacent field oxide layers 11a and 11b each grow to meet in the lower part of silicon nitride layer 7, which then covers the remaining polysilicon 5'. In this situation, the covered polysilicon 5' remains in the active region because it is not removed in a subsequent step. For this reason, the SEPOX technique is difficult to use where the width of an active region is narrow. Also, the width of an isolation region becomes narrower than that of the field oxide layer, resulting in the decrease of punch-through margin.

Further, the width of an isolation region is limited by the width of a photoresist pattern, and therefore, the formation of an isolation region below the optical resolution of the photoresist pattern is therefore impossible. Since a photoresist pattern deforms spatially, when oxidation occurs after patterning the silicon nitride film using the deformed photoresist pattern, adjacent field oxide layers meet each other because of bird's beak, as shown in FIG. 6.

Meanwhile, the depth of the isolation region becomes shallow due to the existence of the buffer layer, since the buffer layer is oxidized prior to the oxidation of the semiconductor substrate.

If the thickness of the polysilicon layer increases, the length of the bird's beak increases, relaxing the stress. Accordingly, as the polysilicon thickness increases, the leakage current decreases because the relaxed stress decreases damage to the substrate, but the bird's beak length increases causing bird's beak encroachment, so that uniformity cannot be controlled.

A number of modified SEPOX techniques have been proposed to solve the problems of the conventional techniques. For example, Japanese Patent Laid-open Publication No. hei 1-98246 by Kazuyoshi Kobayashi discloses a method of: (i) removing part of a surface of an exposed polysilicon, (ii) superimposing a silicon oxide layer on a silicon nitride film, and (iii) using the composite layer (silicon nitride and silicon oxide film) as an anti-oxidative layer in order to decrease the size of the bird's beak. Removing part of the polysilicon in this manner suppresses the bird's beak growth, thereby forming a small field oxide layer. However, the above polysilicon is anisotropically etched such that its etched edge is about 90 degrees with respect to its surface. Here, performing an oxidation process to form a field oxide layer creates an edge at which stresses are focused, thereby causing increased leakage current.

U.S. Pat. No. 4,897,364 by Nguyen et al. discloses a method of decreasing the length of bird's beak using a sidewall spacer comprised of nitride silicon. However, a small aperture which is further decreased in size with a sidewall spacer has poor isolation characteristics because of an insufficient growth of the field oxide layer.

A paper entitled "Poly-Buffer Recessed LOCOS Process for 256 Mbit DRAM Cells" by N. Shimizu et al. (IDEM 92, pp 279–282) discloses a method for preventing punch-through of the field oxide layer. Here, an exposed portion of a polysilicon layer and the surface portion of a semiconductor substrate are partially removed to thereby form a trench (a recessed portion or groove) and then an exposed side of a stress-relief oxide is selectively etched to form lateral undercuts. After oxidizing the exposed silicon substrate and the inside of the undercuts, a thin silicon nitride film is formed on the inner wall of the trench. Thereafter, a recessed field oxide layer is thermally grown in the trench.

W. S. Paik et al. (see "International Symposium on VLSI Technology, Systems and Applications, " May 22–24, 1991 pp. 38–42) suggests a method of preventing a second bird's beak encroachment using a spacer made of polysilicon.

However, even using the above mentioned conventional SEPOX techniques, it is still difficult to manufacture a small field oxide layer because of the limitations of optical resolution, and it is also difficult to manufacture a field oxide layer having good isolation characteristics and low leakage current.

SUMMARY OF THE INVENTION

The present invention provides a method of forming an isolation region in a highly integrated semiconductor device, comprising the steps of:

1) forming a first oxide film, a first polysilicon layer, and a first anti-oxidative layer on a semiconductor substrate;
2) defining an active region and an isolation region;
3) etching the first anti-oxidative layer of the isolation region;
4) isotropically etching a portion of the first polysilicon film;
5) forming a sidewall spacer on a sidewall of the etched first anti-oxidative layer and on a sloped sidewall of the etched first polysilicon layer;
6) etching the remaining first polysilicon layer using the sidewall as a mask; and
7) thermally oxidizing to form the isolation region, thereby isolating an element of a semiconductor device. The first polysilicon layer is wet etched to have an inclination. The remaining first polysilicon layer and the substrate are preferably etched.

According to one embodiment of the present invention, the isotropic etching of the buffer layer is performed until a surface of the semiconductor substrate is exposed.

According to another embodiment of the present invention, the buffer layer is isotropically etched to a depth of more than 50% and less than 100% of a thickness of the buffer layer. After isotropically etching the buffer layer, the buffer layer is anisotropically etched to a depth of the remaining thickness of the buffer layer using the anti-oxidative pattern and spacer as an etching mask, to thereby expose a surface of the semiconductor substrate.

Thereafter, a portion of the exposed surface portion of the semiconductor substrate is preferably anisotropically etched to form a trench in the isolation region of the semiconductor substrate, increasing the isolation depth of the field oxide layer.

OBJECTS OF THE INVENTION

It is an object of the present invention to provide an isolation method for semiconductor devices which is suitable for the manufacture of a field oxide layer which has a size below the limitation of the optical resolution, and also has good isolation characteristics.

It is another object of the present invention to provide an isolation method for semiconductor devices which can reduce the length of a second bird's beak and prevent the encroachment of a second bird's beak which occurs in the conventional SEPOX technique.

It is still another object of the present invention to provide an isolation method for semiconductor devices which can control the length of a first bird's beak and relax the stress in the active region.

It is yet another object of the present invention to provide an isolation method for semiconductor devices which can decrease the leakage current and increase the depth of an isolation region by dispersing the stresses generated by an oxidation step, thereby enhancing isolation characteristics.

BRIEF DESCRIPTION OF THE DRAWINGS

The above features and other advantages of the present invention will become more apparent by describing in detail the preferred embodiments thereof with reference to the attached drawings in which:

FIG. 1 through FIG. 4 are sectional views for illustrating a conventional SEPOX technique;

DESCRIPTION OF THE PREFERRED EMBODIMENTS

Hereinafter, the present invention will be described in detail with reference to particular embodiments.

Embodiment 1

FIGS. 7 to 12 are sectional views for illustrating an isolation method according to one embodiment of the present invention.

Figure 4:
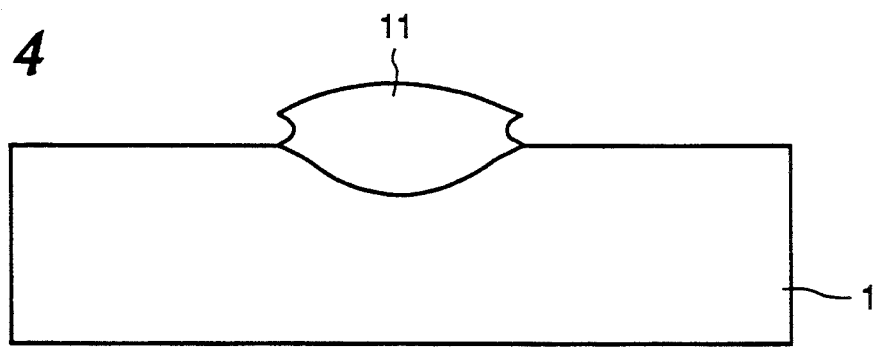
Figure 5:
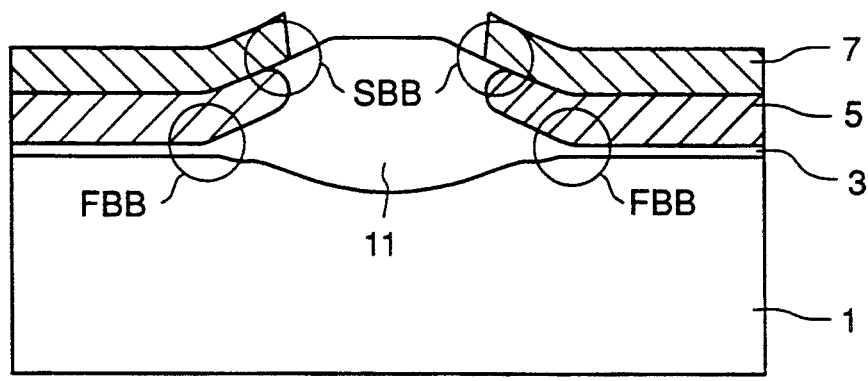
FIG. 5 is an enlarged sectional view of a field oxide layer 11 for explaining the two bird's beak formation which is generated by the conventional SEPOX technique.
Figure 6:
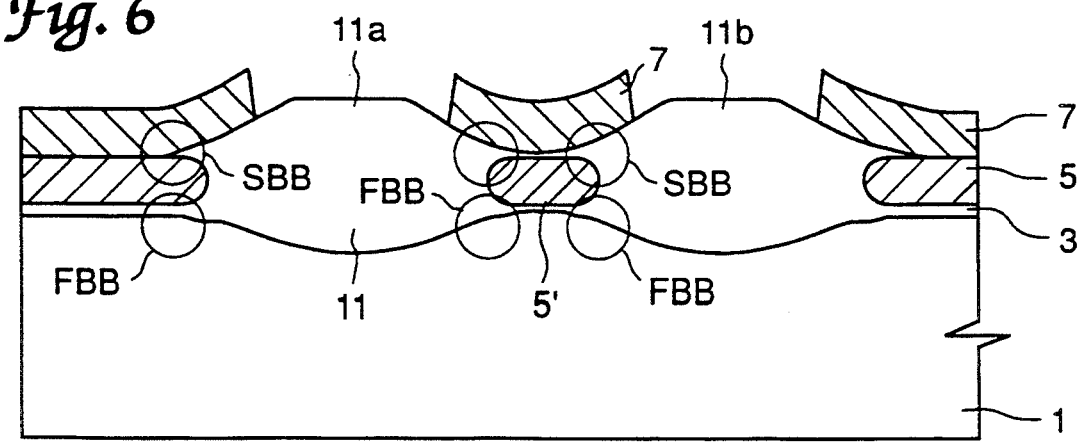
FIG. 6 is a sectional view showing the encroachment of a second bird's beak in the conventional SEPOX technique.
Figure 7:
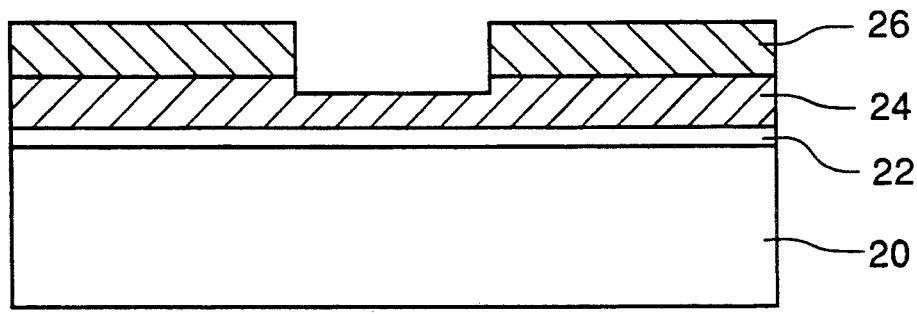
FIGS. 7 to 12 are sectional views for illustrating an isolation method according to a first embodiment of the present invention.

FIG. 7 illustrates the step of forming a buffer layer 24 and an anti-oxidative pattern 26 on a semiconductor substrate 20. A pad oxide film 22 is formed on semiconductor substrate 20 via a conventional thermal oxidation method, and then the buffer layer 24 is formed on the pad oxide film 22. The buffer layer 24 is formed by low-pressure chemical vapor deposition (LPCVD) using an amorphous or a polycrystalline silicon which has similar physical properties to those of the semiconductor substrate 20. The pad oxide film 22 and buffer layer 24 are formed so that they have sufficient thickness to relax stresses caused when the field oxide layer is formed in a subsequent oxidation step, and to act as an etch-blocking layer. Additionally, they should be formed so that they can control the length of the bird's beak when a field oxide layer is formed using a small pattern. With these concerns in mind, the thickness of the pad oxide film 22 is preferably 50 to 300Å, and more preferably 100 to 200Å, while the thickness of the buffer layer 24 is preferably 300 to 1,500Å, and more preferably 700 to 1,100Å.

If the buffer layer 24 is exposed to the atmosphere, native oxide will grow to form a native oxide film (not shown) having a thickness of about 10 to 100Å thereon. Since the oxidant (oxygen) has a faster diffusion speed in this native oxide film than in a polysilicon layer or a nitride silicon layer, the existence of the native oxide film results in an increase in the size of the second bird's beak.

Thereafter, the semiconductor substrate 20, on which buffer layer 24 has been formed, is heat-treated in a nitrification atmosphere, such as a nitrogen atmosphere. This nitrifies the native oxide film which exists on the buffer layer 24, converting it into a silicon oxynitride layer having a SiON structure. The diffusion speed of an oxidant in the silicon oxynitride layer is similar to that in silicon nitride. Converting the native oxide film to a silicon oxynitride film suppresses the diffusion of oxidant and makes for fewer defects on the grain boundary of the buffer layer by stabilizing the interface between the buffer layer and the silicon nitride layer (which is an anti-oxidative layer formed in the subsequent step), thereby suppressing the growth of a second bird's beak.

A nitride film acting as an anti-oxidative layer is then formed to a thickness of 1,500 to 2,500Å, and preferably 2,000Å, on the above oxynitride film by an LPCVD method. On the anti-oxidative layer, a resist is coated to form a resist layer, which is patterned via a photolithograpy process using a KrF stepper, thereby forming a resist pattern (not shown) on an active region. By using the resist pattern as an etching mask, the nitride layer is etched by reactive ion etching (RIE) to give an anti-oxidative pattern 26 having an opening. This opening defines an isolation region and exposes a portion of the buffer layer 24. Then, the remaining resist pattern is stripped away.

Figure 8:
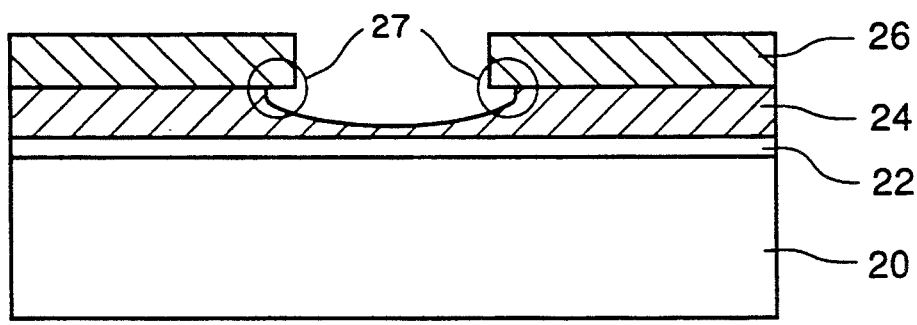

FIG. 8 illustrates the step of isotropically etching a portion of the buffer layer 24 to form an undercut portion 27 in the lower portion around the opening.

After the step of FIG. 7, if the exposed portion of buffer layer 24 is continuously isotropically etched away by a plasma etching process, then an undercut portion having round edges around the lower portion of the opening are formed. This isotropic etching can be performed via a conventional wet or dry etching process. In the present embodiment, this isotropic etching is performed by wet etching at an etching rate of 10 to 100Å per minute, while maintaining an etching selectivity of 40 to 1 (of the buffer layer 24 with respect to the anti-oxidative pattern 26). This isotropic etching may be performed before the removal of the resist pattern.

The isotropic etching may be performed to a depth more than 50% and less than 100% of the thickness of the buffer layer 24, or until the surface of the pad oxide film 22 (which is under the buffer layer 24) is exposed. For example, in the present embodiment when the thickness of buffer layer 24 is 700 to 1,100Å, the etching depth of the isotropic etched portion is about 500Å.

Forming the round undercut portion by isotropically etching in this manner can disperse the stresses caused when a field oxide layer is formed in a subsequent step.

The buffer layer 24 is etched by isotropic etching inside an opening of the anti-oxidative pattern 26 (which is formed by using the resist pattern), to increase the size of the opening in the isolation region while maintaining a uniform region in which a first bird's beak formation is controlled. This prevents the formation of a small field oxide layer which usually results from a small pattern.

Forming the round undercut portion prevents the expansion of the second bird's beak, since the overlapping of the second bird's beak increases. Therefore, the portion of the buffer layer which remains after the formation of the field oxide layer can be easily removed.

Figure 9:
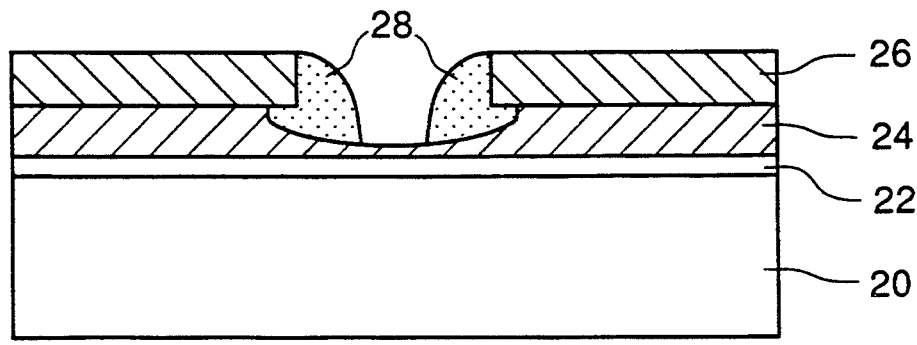

FIG. 9 illustrates the step of forming an anti-oxidative spacer 28 which fills the undercut portion 27 on the sidewall of the opening. A native oxide film which has been formed on the exposed etched portion is heat-treated under a nitrification atmosphere, such as an nitrogen atmosphere, so that it is converted into an oxynitride film in the same manner as explained in FIG. 7. Then, on the whole surface of the result, a silicon nitride layer (not shown) which fills the undercut portion is formed continuously by LPCVD. The nitride layer is anisotropically etched until the buffer layer 24 in the opening is exposed, thereby forming the anti-oxidative spacer 28 which fills undercut portion 27. The step of forming the anti-oxidative spacer 28 can be easily performed according to conventionally known methods.

The anti-oxidative pattern and spacer are preferably formed using a material which can protect the substrate or the polysilicon from oxidation in the oxidation step, and can be easily isolated and removed from the field oxide layer. Examples of such a material include silicon nitride.

Figure 10:
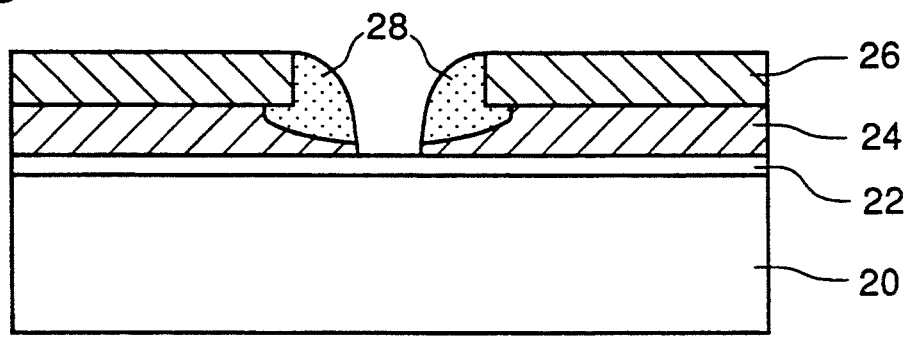

FIG. 10 illustrates the step of removing a portion of buffer layer 24 that is exposed between anti-oxidative spacers 28. The exposed buffer layer portion between the anti-oxidative spacers 28 is anisotropically etched away until the pad oxide film 22 is exposed. This step can be omitted when the undercut portion 27 is formed by isotropically etching buffer layer 24 until the surface of pad oxide film 22 is exposed (as explained in FIG. 8), or when a deep isolation depth is unnecessary.

Figure 11:
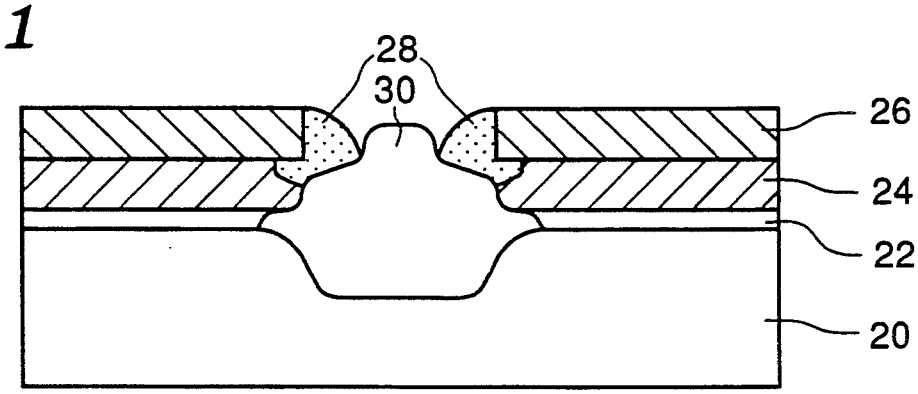

FIG. 11 illustrates the step of forming a field oxide layer 30. A portion of the buffer layer 24 which is exposed by the opening and the surface portion of semiconductor substrate 20 around the opening are partially oxidized to form a field oxide layer 30 having a thickness of about 4,000Å.

Figure 12:
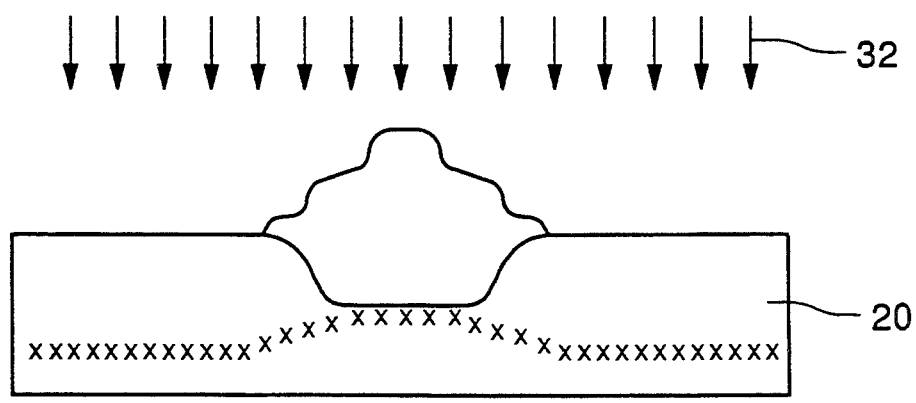

FIG. 12 illustrates steps of removing the anti-oxidative pattern 26, the anti-oxidative spacer 28, the buffer layer 24, and the pad oxide film 22, and then implanting ions to form a channel-stop layer. The anti-oxidative pattern 26 and the anti-oxidative spacer 28 are removed by a conventional method, and then the remaining buffer layer 24 and the pad oxide film 22 are subsequently removed to expose the semiconductor substrate 20. Thereafter, ions 32 are implanted in order to form a channel-stop layer, thereby forming an impurity-doped region in the upper portion of the semiconductor substrate 20.

Embodiment 2

FIGS. 13 to 18 are sectional views for illustrating an isolation method according to a second embodiment of the present invention.

In the present embodiment, the steps are repeated in the same manner as in Embodiment 1 of FIGS. 7 to 12, except that the buffer layer 24 is replaced by a composite layer comprised of a first buffer layer, an etch-blocking layer, and a second buffer layer.

Figure 13:
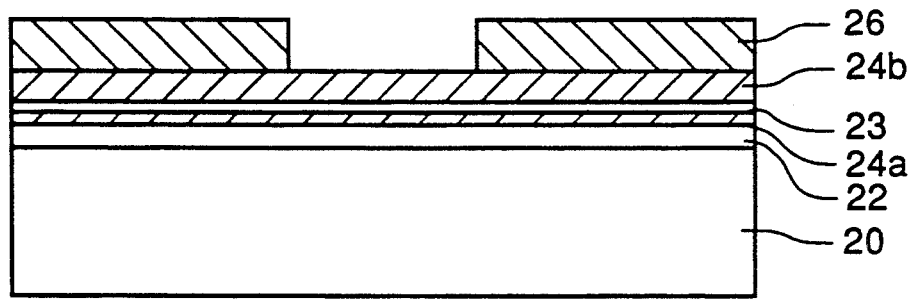
FIGS. 13 to 18 are sectional views for illustrating an isolation method according to a second embodiment of the present invention.

FIG. 13 illustrates the step of forming a composite layer which is comprised of a first buffer layer 24a, an etch-blocking layer 23, and a second buffer layer 24b, and forming an anti-oxidative pattern 26. After forming a pad oxide film 22 on a semiconductor substrate 20 via a conventional thermal oxidation, a first buffer layer 24a is formed on the pad oxide film 22. The pad oxide film 22 is formed in the same manner as in Embodiment 1. The first buffer layer 24a is also formed in the same manner as was buffer layer 24 in Embodiment 1, except that its thickness is less than half the total thickness of buffer layer 24 of Embodiment 1. The thickness of the first buffer layer 24a is preferably 10% to 40% of the total thickness of buffer layer 24 of Embodiment 1.

Then, the etch-blocking layer 23 is formed on the first buffer layer 24a. The etch-blocking layer 23 stabilizes the isotropic etching step of the buffer layer. The etch-blocking layer 23 is formed to a thickness of 100 to 200Å. The etch-blocking layer 23 is formed by depositing a material (such as silicon oxide or silicon nitride) which has a high etching selectivity with respect to the first buffer layer 24a (amorphous silicon or polysilicon).

A second buffer layer 24b is formed on the etch-blocking layer 23 using the same material as that of first buffer layer 24a. Then, an antioxidative pattern 26 having an opening is formed in the same manner as in Embodiment 1.

Figure 14:
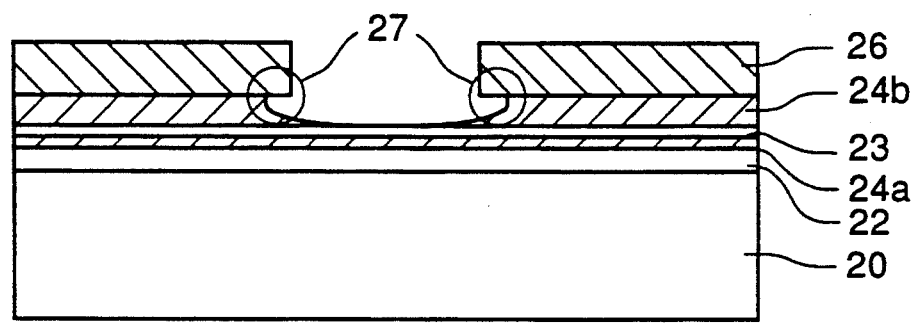

FIG. 14 illustrates the step of forming an undercut portion 27 in the lower portion around the opening by isotropically etching the exposed portion of the second buffer layer 24b. The exposed portion of the second buffer layer 24b is isotropically etched in the same manner as in Embodiment 1 to form an undercut portion 27 having a round edge around the lower portion of the opening. Since the isotropic etching is performed until the etch-blocking layer 23 is exposed, the isotropic etching process is stabilized and shows good reproducibility.

Figure 15:
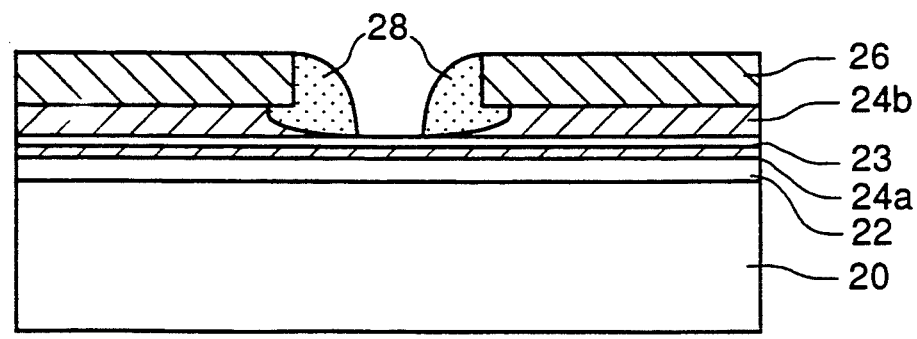

FIG. 15 illustrates the step of forming anti-oxidative spacers 28 which fill the undercut portions 27 on the sidewall of the opening. This step may be performed in the same manner as explained with reference to FIG. 9 of Embodiment 1.

Figure 16:
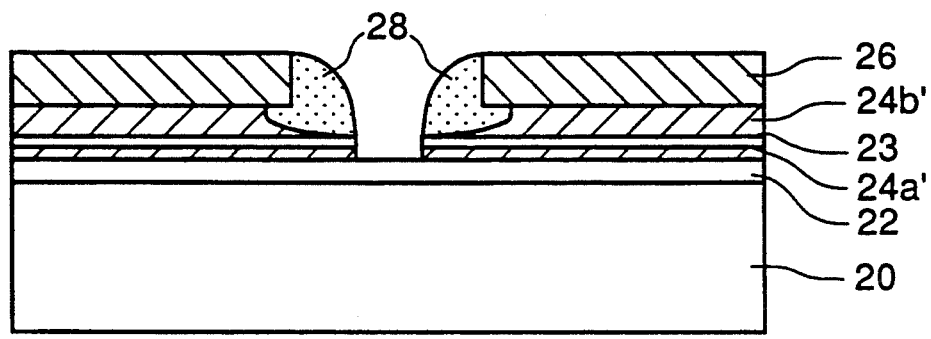

FIG. 16 illustrates the step of removing portions of the first buffer layer 24a and the etch-blocking layer 23 which are exposed between the two anti-oxidative spacers 28. The etch-blocking layer 23 and the first buffer layer 24a which are exposed between the anti-oxidative spacers 28 are anisotropically etched until the pad oxide film 22 is exposed. Etching the first buffer layer 24a can be omitted if a deep isolation depth is unnecessary, as explained in Embodiment 1.

Figure 17:
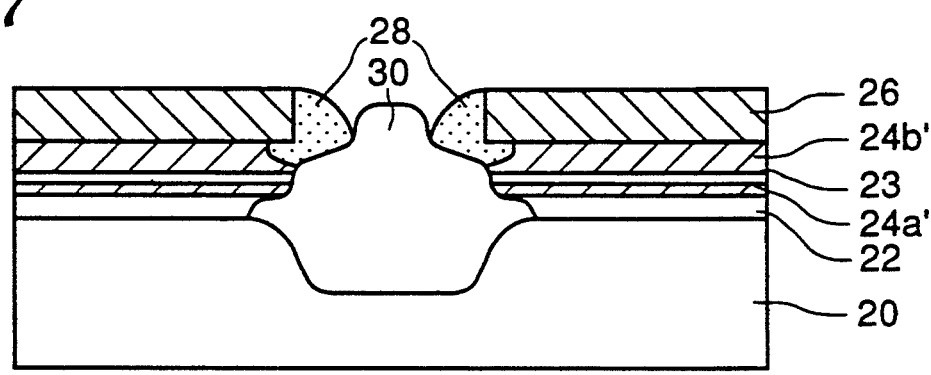

FIG. 17 illustrates the step of forming a field oxide layer 30 by thermal oxidation in the same manner as in Embodiment 1.

Figure 18:
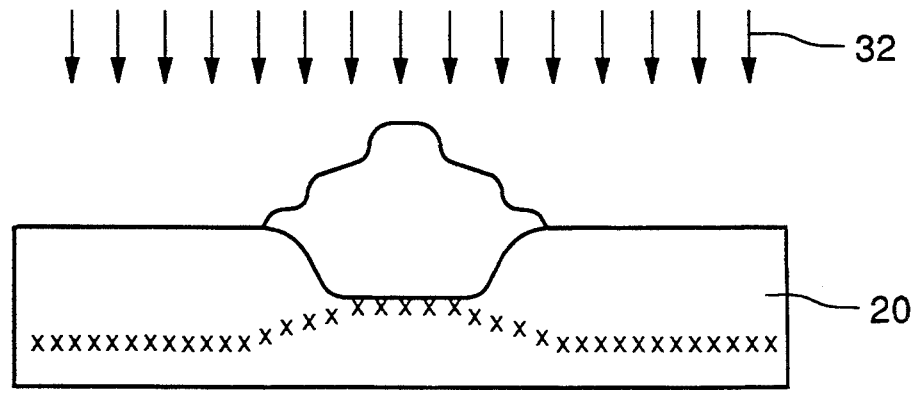

FIG. 18 illustrates the step of removing the remaining anti-oxidative pattern 26, the anti-oxidative spacers 28, the second buffer layer 24b, the etch-blocking layer 23, the first buffer layer 24a, and the pad oxide film 22. The result is ion-implanted in order to form a channel-stop layer. After forming the field oxide layer in the same manner as in Embodiment 1, the remaining anti-oxidative pattern 26, the anti-oxidative spacers 28, the second buffer layer 24b, the etch-blocking layer 23, the first buffer layer 24a, and the pad oxide film 22 are wet-etched away via a conventional method. Ions 32 are implanted so as to form a channel-stop layer, thereby forming an impurity-doped region in the upper part of the semiconductor substrate 20.

Embodiment 3

Figure 19:
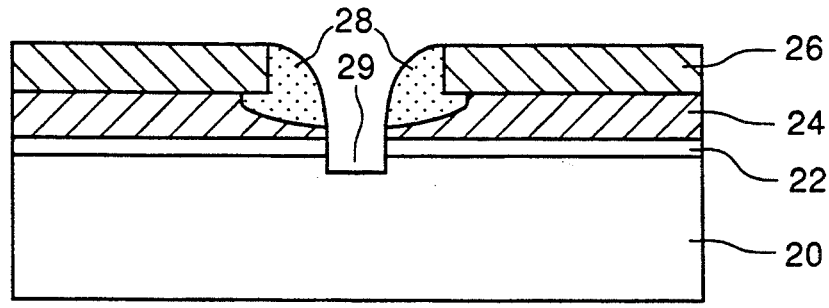
FIGS. 19 and 20 are sectional views for illustrating an isolation method according to a third embodiment of the present invention.
Figure 20:
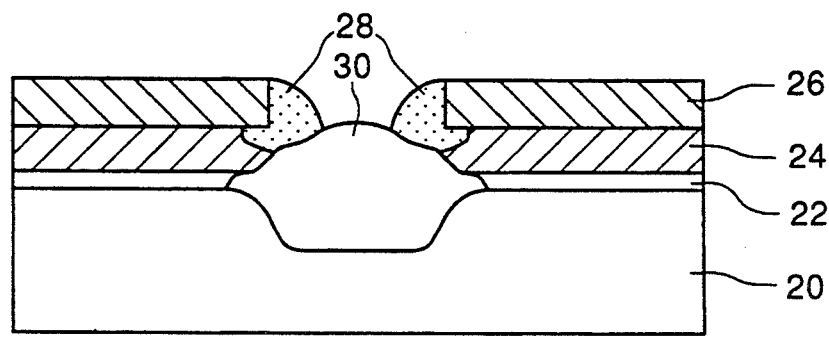

FIG. 19 and FIG. 20 are sectional views for illustrating an isolation method according to a third embodiment of the present invention.

In the present embodiment, the steps are repeated in the same manner as in Embodiment 1, except that a trench is formed by etching a surface portion of the semiconductor substrate 20 between the two opposite anti-oxidative spacers 28.

FIG. 19 illustrates the step of removing a portion of the buffer layer 24 which is exposed between the anti-oxidative spacers 28, and then anisotropically etching the surface portion of the semiconductor substrate 20 to form a trench 29. After repeating the steps shown in FIGS. 7 to 9, a portion of the buffer layer 24 which is exposed between the anti-oxidative spacers 28 is anisotropically etched away using the anti-oxidative pattern 26 and the anti-oxidative spacers 28 as an etching mask until pad oxide film 22 is exposed. Then, a trench 29, having a depth of about 0.1 μm to 0.5 μm, is formed between the anti-oxidative spacers 28 by anisotropically etching the exposed portion of the pad oxide film 22 and the surface portion of the semiconductor substrate 20. Performing oxidation after forming the trench 29 in this manner enables the field oxide layer to form in a deep portion of the semiconductor substrate 20.

FIG. 20 illustrates the step of forming a field oxide layer 30. A field oxide layer 30 is formed by performing an oxidation process in the same manner as in Embodiment 1 after the step of FIG. 19. Then, the remaining anti-oxidative pattern 26, the anti-oxidative spacers 28, the buffer layer 24 and the pad oxide film 22 are removed. Ions are implanted so as to form a channel-stop layer. As a result, an impurity-doped region is formed on the upper portion of the semiconductor substrate 20.

Embodiment 4

Figure 21:
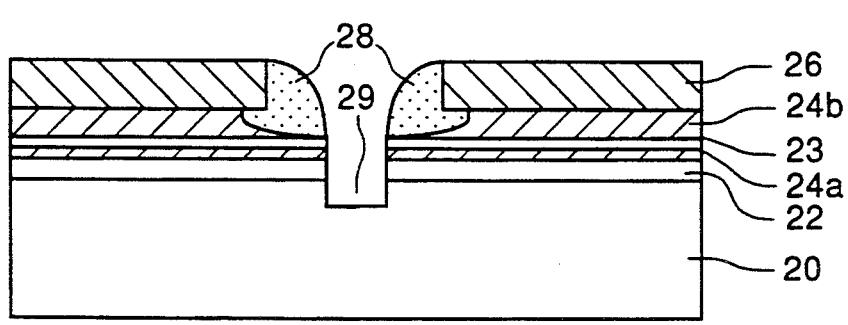
FIGS. 21 and 22 are sectional views for illustrating an isolation method according to a fourth embodiment of the present invention.
Figure 22:
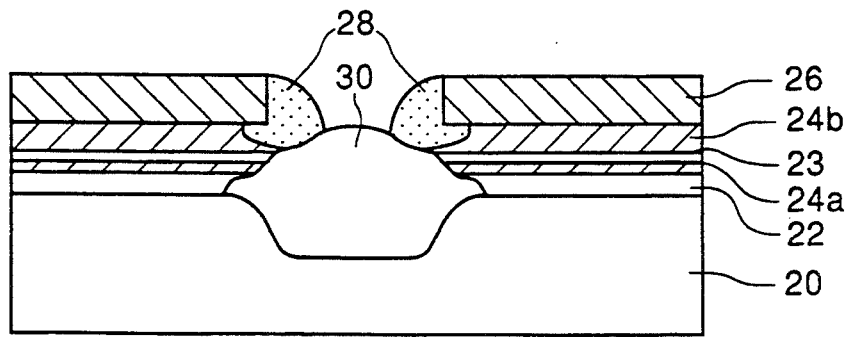

FIG. 21 and FIG. 22 are sectional views for illustrating an isolation method according to a fourth embodiment of the present invention.

In the present embodiment, the procedure is repeated in the same manner as in Embodiment 1, except that the buffer layer 24 is replaced by a composite layer made of a first buffer layer, an etch-blocking layer, and a second buffer layer. Additionally, a trench is formed by etching the surface portion of the semiconductor substrate 20 between anti-oxidative spacers 28. Therefore, the present embodiment combines the steps which are described in Embodiments 2 and 3.

FIG. 21 illustrates the steps of removing a portion of an etch-blocking layer 23 which is exposed between anti-oxidative spacers 28, removing a portion of a first buffer layer 24a, and then forming a trench 29. After repeating the steps described in FIGS. 13 to 15 of Embodiment 2, the etch-blocking layer 23 which is exposed between the anti-oxidative spacers 28 and a portion of the first buffer layer 24a are removed to expose a portion of the pad oxide film 22. Then, the exposed portion of the pad oxide film 22 is removed, and the trench 29 is formed in the semiconductor substrate 20 by anisotropic etching in the same manner as in Embodiment 3.

FIG. 22 illustrates the step of forming a field oxide layer 30. A field oxide layer 30 is formed by oxidation in the same manner as in Embodiment 1. Then, the remaining anti-oxidative pattern 26, the anti-oxidative spacers 28, the second buffer layer 24b, the etch-blocking layer 23, the first buffer layer 24a, and the pad oxide film 22 are removed. Ions are implanted to form a channel-stop layer. As a result, an impurity-doped region is formed in the upper portion of the semiconductor substrate 20.

Comparative Tests

Figure 23:
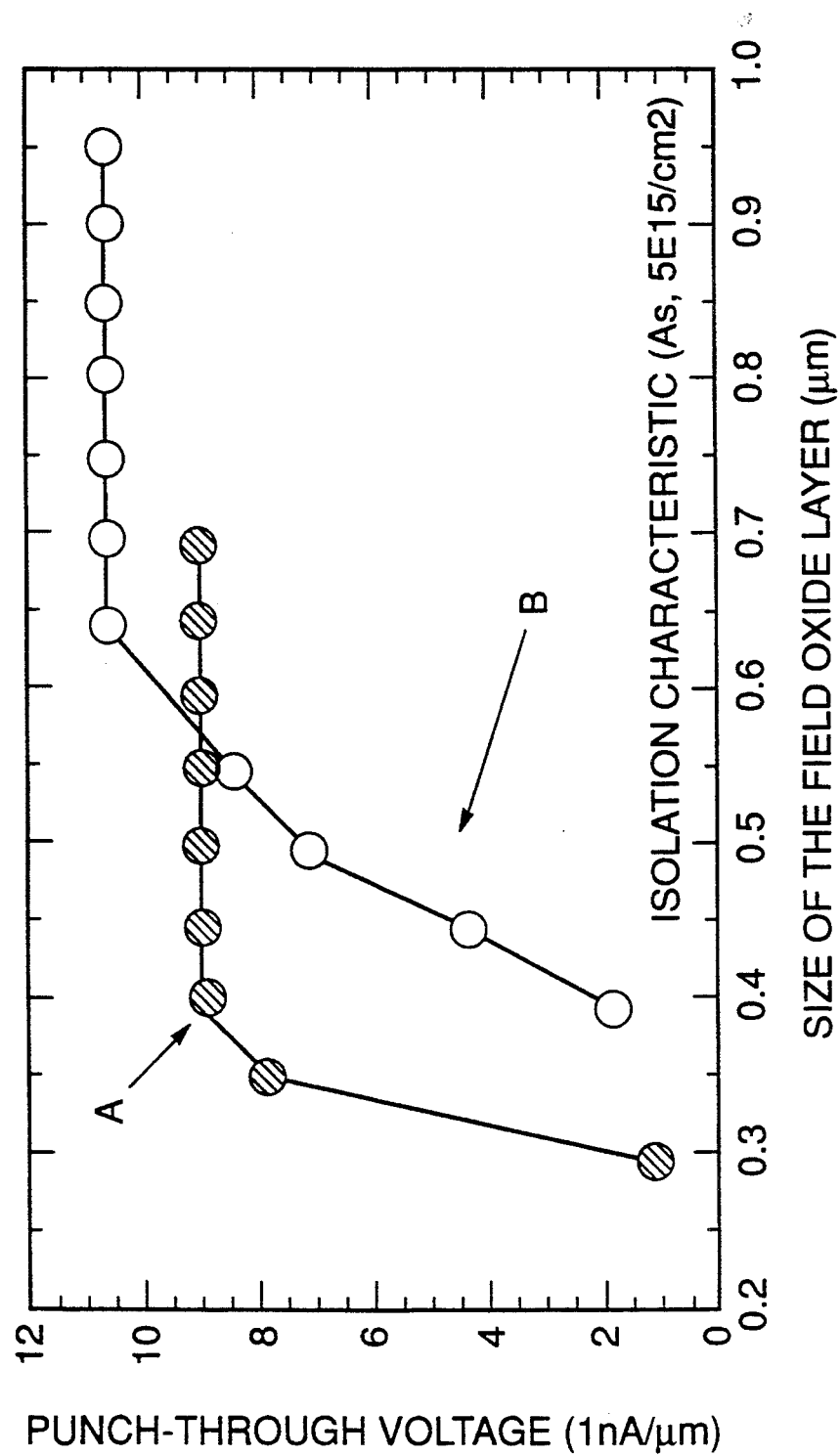
FIG. 23 is a graph illustrating the isolation characteristics of the N+ region of a field oxide layer obtained according to a method of the present invention in comparison with the conventional SEPOX technique.
Figure 24:
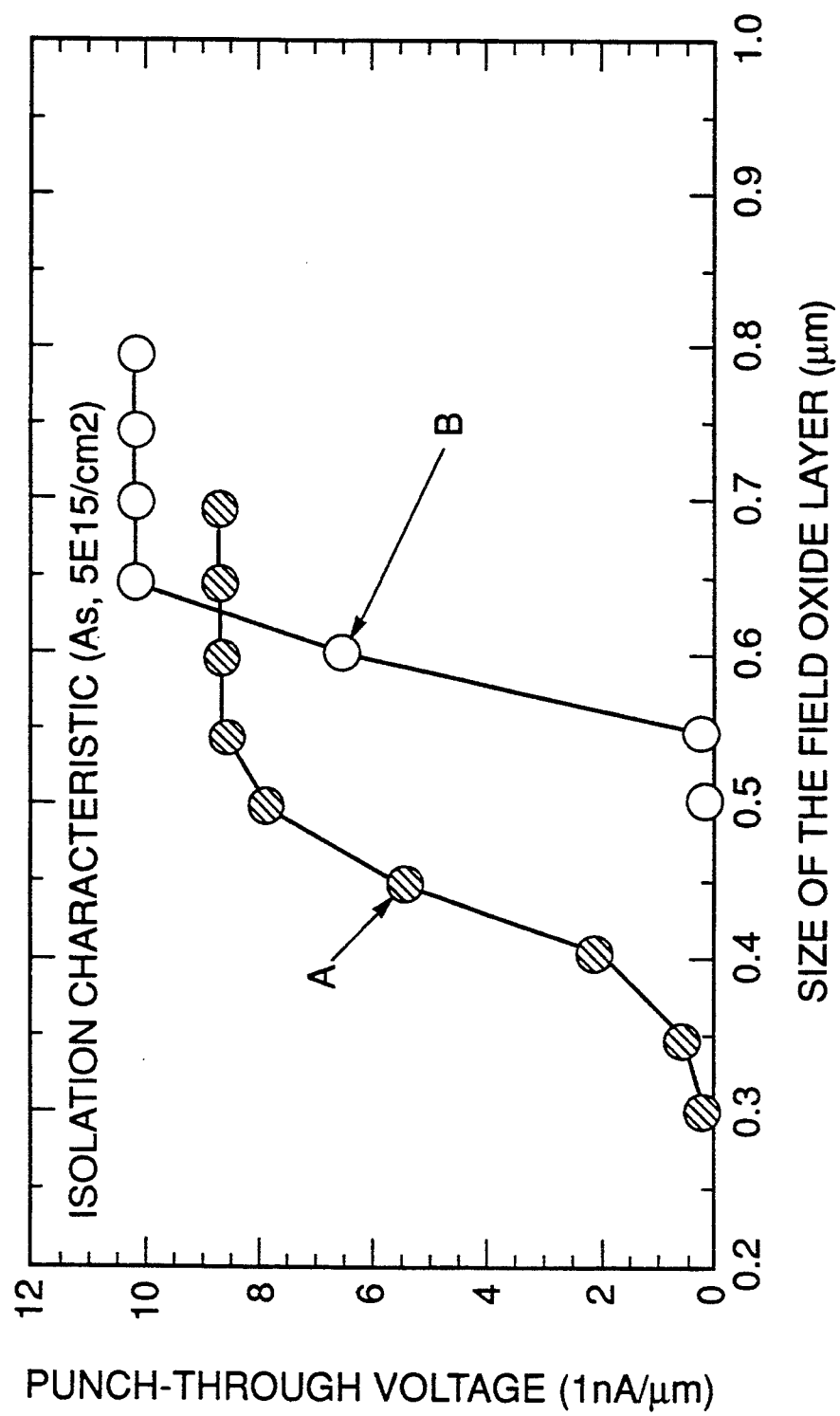
FIG. 24 is a graph illustrating the isolation characteristics of the P+ region of a field oxide layer obtained according to a method of the present invention in comparison with the conventional SEPOX technique.

Isolation regions were formed both according to the method described in Embodiment 1 and also according to conventional SEPOX techniques. Punch-through voltages were then measured for the isolation regions formed using both methods. FIGS. 23 and 24 are graphs illustrating the isolation characteristics of an N+ region and a P+ region of a field oxide layer obtained according to a method of the present invention in comparison with the conventional SEPOX technique, respectively.

The size of a field oxide layer is defined by the lateral distance from one end to the other end along a surface of the semiconductor substrate. The thickness of the grown field oxide layer was 4,000Å, and N+ impurity regions were formed by implanting As at a dose of $5E15/cm^2$, while P+ impurity regions were formed by implanting $BF_2$ at a dose of $5E15/cm^2$. The plots labeled "A" in both FIG. 23 and FIG. 24 characterize the isolation of the field oxide layers obtained according to the method of the present invention, while the plots labeled "B" in both FIG. 23 and FIG. 24 characterize the isolation of field oxide layers obtained according to the conventional SEPOX technique. As shown in FIG. 23 and FIG. 24, the present invention produces a higher punch-through voltage in a small isolation region than that by the conventional SEPOX technique, thereby increasing the margin when forming an isolation region.

According to the present invention, the size of an opening which defines the region where a field oxide layer is to be formed can be reduced by using a spacer, and therefore a field oxide layer having a size below the optical resolution can be formed. Additionally, the size of the bird's beak can be reduced, while decreasing the leakage current of a field oxide layer. When forming a composite layer which includes an etch-blocking layer as a buffer layer, the method of the present invention is stable and reproducible. Further, forming a trench between the spacers increases the isolation depth without widening the isolation between the elements, thereby enhancing the isolation characteristics. In addition, the three dimensional distortion effect caused by the use of a conventional SEPOX technique is reduced. Thus, after a field oxide layer is formed, the remaining polysilicon can be easily removed.

While the present invention has been particularly shown and described with reference to particular embodiments thereof, it will be understood by those skilled in the art that various changes in form and details may be effected therein without departing from the spirit and scope of the invention as defined by the appended claims.

What is claimed is:

1. A method of forming an isolation region in a semiconductor device comprising the steps of:

forming a first oxide film, a first polysilicon layer and a first anti-oxidative layer on a semiconductor substrate;

defining an isolation region;

etching said first anti-oxidative layer of said isolation region;

etching a first portion of said first polysilicon layer thereby leaving a remaining portion;

forming a sidewall spacer on a sidewall of said etched first anti-oxidative layer and on a sidewall of said etched first portion of said first polysilicon layer;

etching said remaining portion of said first polysilicon layer using said sidewall spacer as a mask; and thermally oxidizing said semiconductor device to form said isolation region.

2. A method as claimed in claim 1, wherein said etching of said first portion of said first polysilicon layer is wet etching, said remaining portion of said first polysilicon layer thereby have an inclination.

3. A method as claimed in claim 1, wherein said remaining portion of said first polysilicon layer and said semiconductor substrate are etched.

4. An isolation method of a semiconductor device comprising the steps of:

forming a buffer layer on a semiconductor substrate;

forming on said buffer layer an anti-oxidative pattern with an opening which defines an isolation region and exposes a portion of said buffer layer;

isotropically etching said exposed portion of said buffer layer to form an undercut remaining portion around said opening;

forming an anti-oxidative sidewall spacer which fills said undercut portion on a sidewall of said opening; and partially oxidizing said remaining portion of said buffer layer which is exposed by said opening and said sidewall spacer to thereby form a field oxide layer.

5. An isolation method as claimed in claim 4, wherein said isotropic etching of said exposed portion of said buffer layer is performed until an underlying layer thereof is exposed.

6. An isolation method as claimed in claim 4, wherein said buffer layer is isotropical etching of said exposed portion of said buffer layer is performed until said remaining portion has a depth of more than 50% and less than 100% of an original thickness of said buffer layer.

7. An isolation method as claimed in claim 6, further comprising a step after the step of isotropically etching said exposed portion of said buffer layer of:

anisotropically etching said remaining portion of said buffer layer using said anti-oxidative pattern and said sidewall spacer as an etching mask, whereby an underlying layer thereof is exposed.

8. An isolation method as claimed in claim 7, further comprising a step of:

anisotropically etching a portion of said underlying layer of said buffer layer.

9. An isolation method as claimed in claim 4, further comprising a step before the step of forming said buffer layer of:

forming a pad oxide film on said semiconductor substrate.

10. An isolation method as claimed in claim 4, wherein said anti-oxidative pattern formed on said buffer layer and said sidewall spacer comprise silicon nitride.

11. An isolation method as claimed in claim 4, wherein said buffer layer comprises a polysilicon silicon.

12. An isolation method as claimed in claim 4, wherein said buffer layer comprises an amorphous silicon.

13. An isolation method as claimed in claim 4, wherein said buffer layer comprises:

a first buffer layer;

an etch-blocking layer formed on said first buffer layer; and a second buffer layer formed on said etch-blocking layer.

14. An isolation method as claimed in claim 13, wherein said etch-blocking layer comprises silicon nitride.

15. An isolation method as claimed in claim 13, wherein said etch-blocking layer comprises silicon oxide.

16. An isolation method as claimed in claim 4, further comprising a step before the step of forming said anti-oxidative pattern on said buffer layer of:

heat-treating under a nitrification atmosphere a native oxide layer formed on said buffer layer when exposed to a natural atmosphere.

* * * * *